United States Patent [19]
Bao et al.

[11] Patent Number: 6,107,117
[45] Date of Patent: Aug. 22, 2000

[54] METHOD OF MAKING AN ORGANIC THIN FILM TRANSISTOR

[75] Inventors: Zhenan Bao, North Plainfield; Ananth Dodabalapur, Millington; Yi Feng, Bridgewater; Venkataram Reddy Raju, New Providence, all of N.J.

[73] Assignee: Lucent Technologies Inc., Murray Hill, N.J.

[21] Appl. No.: 08/770,535

[22] Filed: Dec. 20, 1996

[51] Int. Cl.[7] .................................................. H01L 51/40
[52] U.S. Cl. ........................... 438/99; 438/151; 438/158; 438/257
[58] Field of Search .............................. 438/99, 158, 151, 438/257

[56] References Cited

U.S. PATENT DOCUMENTS

| | | |
|---|---|---|
| 5,498,761 | 3/1996 | Weeling et al. . |
| 5,574,291 | 11/1996 | Dodabalapur et al. . |
| 5,596,208 | 1/1997 | Dodabalapur et al. . |

OTHER PUBLICATIONS

Garnier, et al., All–Polymer Field–Effect Transistor Realized by Printing Techniqes, Sep. 16, 1994.
Yutaka Ohmori et al. "Fabrication and Characteristics of Schottky Gated Poly (3–Alkylthiophene) Field Effect Transistors", *Japanese Journal of Applied Physics*, vol. 30, No. 4A, pp. L610–L611 (1991).
Hiroyuki Fuchigami et al. "A New Type of TFT Based on a Polymeric Semiconductor", *Japanese Journal of Applied Physics*, Supplements, pp. 596–598 (1991).
Xuezhou Peng et al. "All–Organic Thin–Film Transistors Made of Alpha–Sexithienyl Semiconducting and Various Polymeric Insulating Layers", *Applied Physics Letters*, vol. 57, No. 19, pp. 2013–2015 (1990).
Dimitrakopoulos, C.D. et al. "trans–trans–2, 5-bis–2–{5–2, 2'–bithienyl} ethenylthiophene: *synthesis*, characterization, thin film deposition and fabrication of organic field–effect transistors", Synthetic Metals, vol. 89, No. 3, pp. 193–197 (1997).
Chen, F. et al. "Improved Electroluminescence Performance of Poly 3–(Alkylthiophenes) having a High Head–To–Tail (HT) Ratio", Journal of Materials Chemistry, vol. 6, No. 11, pp. 1763–1766 (1996).
Horowitz, G. et al. "Structure dependent properties or organic field–effect transistors" Proceedings of 9th ISH-M–European Hybrid Microelectronics Conference, p. 60–67 (1993).
Bao, Zhenan, et al. "Soluble and processable regioregular poly(3–hexylthiophene) for thin film field–effect transistor applications with high mobility" *Applied Physics Letters*, vol. 69, No. 26, pp. 4108–4110 (1996).
F. Garnier, et al. "All–Polymer Field–Effect Transistor Realized by Printing Techniques", *Science*, vol. 265, pp. 1684–1686 (1994).
A. Tsumura, et al. "Macromolecular electronic device: Field–effect transistor with a polythiophene thin film", *Appl. Phys. Lett.*, vol. 49 (18), pp. 1210–1212, (1986).
A. Assadi, et al. "Field–effect mobility of poly(3–hexylthiophene)", *Appl. Phys. Lett.* vol. 53(3) pp. 195–197, (1988).
H. Fuchigami, et al. "Polythienylenevinylene thin–film transistor with high carrier mobility", Apl. Phys. Lett., vol. 63(10), No. 6, pp. 1372–1374 (1993).

Primary Examiner—Richard Booth
Assistant Examiner—Jonathan Hack
Attorney, Agent, or Firm—Richard J. Botos

[57] ABSTRACT

A process for fabricating thin film transistors in which the active layer is an organic semiconducting material with a carrier mobility greater than $10^{-3}$ cm$^2$/Vs and a conductivity less than about $10^{-6}$ S/cm at 20° C. is disclosed. The organic semiconducting material is a regioregular (3-alkylthiophene) polymer. The organic semiconducting films are formed by applying a solution of the regioregular polymer and a solvent over the substrate. The poly (3-alkylthiophene) films have a preferred orientation in which the thiophene chains has a planar stacking so the polymer backbone is generally parallel to the substrate surface.

16 Claims, 2 Drawing Sheets

METHOD OF MAKING AN ORGANIC THIN FILM TRANSISTOR

FIELD OF THE INVENTION

The present invention relates generally to thin film transistors (TFTs) incorporating an active layer of organic material, and to methods for making such transistors.

DESCRIPTION OF THE RELATED ART

Recently, organic materials have been investigated for use as the active semiconductor layer in thin film field effect transistors (FETs). Organic materials are attractive for use as the active semiconductor layer in thin film devices because they are easily processable and are compatible with the plastic substrates on which thin film FETs are typically formed. Such advantages are important when fabricating low-cost, large area devices. In order for an organic material to be useful as the active semiconductor layer in thin film FETs, the resulting devices must have an acceptable on/off ratio. Typically, thin film FETs must have an on/off ratio of at least $10^3$. The term on/off ratio as used in this disclosure refers to the ratio of the source-drain current when the transistor is on to the source-drain current when the transistor is off.

The properties of the organic semiconductor material that indicate whether the material is suitable for use as an active semiconductor layer are the carrier mobility and the conductivity. The carrier mobility ($\mu$) is a measure of the average particle (e.g., electrons, holes) drift velocity in the layer of semiconducting material and is important because it determines how strongly the motion of such particles are influenced by an applied electric field. The conductivity ($\sigma$) describes the ability of the semiconducting material layer to conduct an electric charge. The conductivity is related to the carrier mobility through where p is the carrier density and q is the elemental charge. Organic semiconducting materials with carrier mobilities greater than about $10^{-3}$ cm$^2$/Vs (centimeters$^2$/Volt-second) and conductivities less than about $10^{-5}$ S/cm (Siemens/ centimeter) are potentially useful as the active semiconductor layer in thin film FETs. FETs having an active semiconducting layer with such properties will have an on/off ratio of at least about $10^3$.

Three methods have been used to fabricate organic thin film transistor (TFT) devices: electrochemical polymerization, solution application and vacuum deposition. Tsumura, A., et al., "Macromolecular electronic device: Field-effect transistor with a polythiophene thin film", *Appl. Phys. Lett.*, vol. 49 (18), pp. 1210–1212 (1986), discusses the formation of a semiconducting organic polymer using electrochemical polymerization of 2,2'-bithiophene with tetraethylanmmonium perchlorate electrolyte in an acetonitrile solution at a constant current of 100 $\mu$A/cm$^2$ (microamperes/centimeter$^2$). The organic polymer formed using such electrochemical polymerization is a polythiophene compound having a carrier mobility of about $10^{-5}$ cm$^2$/Vs, which makes this material unsatisfactory for use in thin film FETs.

Assadi, A., et al., "Field-effect mobility of poly(3-hexylthiophene)", *Appl. Phys. Lett.*, vol. 53 (3), pp. 195–197 (1988), discusses the formation of an amorphous poly(3-alkylthiophene) semiconducting polymer film from the dissolution of poly (3-hexylthiophene) in chloroform at a concentration of 1 mg/ml, which is thereafter spin coated on a substrate. The organic polymer formed is a poly (3-hexylthiophene) film having a carrier mobility of about $10^{-5}$ cm$^2$/Vs to $10^{-4}$ cm$^2$/Vs, which makes this material unsatisfactory for use in thin film devices.

Fuchigami, H., et al., "Polythienylenevinylene thin-film transistor with high carrier mobility", *Appl. Phys. Lett.*, vol. 63(10), pp. 1372–1374 (1993), discusses the formation of a polythienylenevinylene semiconducting film from a soluble precursor of the polymer. The precursor polymer is deposited from solution and then converted through chemical reaction to the semiconducting polymer. Organic semiconducting polymers formed using the two-step Fuchigami et al. process have carrier mobilities of about $10^{-1}$ cm$^2$/Vs.

Organic semiconducting polymers formed from the vacuum deposition of oligomers such as oligothiophenes are described in Garnier, F., et al,, "All-Polymer Field-Effect Transistor Realized by Printing Techniques", *Science*, vol. 265, pp. 1684–1686 (1994). The organic semiconducting polymers formed using vacuum deposition have carrier mobilities of about $10^{-2}$ cm$^2$/Vs. However, the process described in Garnier et al. requires the use of expensive evaporation tools, so as to limit the utility of such a process for fabricating low-cost thin film FETs.

Accordingly, techniques useful for forming organic semiconductor layers continue to be sought.

SUMMARY OF THE INVENTION

The present invention is directed to a process for making a semiconductor thin film transistor (TFT), in which the active layer is an organic material having a carrier mobility greater than $10^{-3}$ cm$^2$/Vs and a conductivity less than about $10^{-5}$ S/cm. The organic semiconductor material is a homopolymer of 3-alkylthiophene monomers. The homopolymer has a regioregular structure.

In the regioregular homopolymer of 3-alkylthiophene monomers, the orientation of the alkyl group (R group) on a given thiophene moiety is regular with respect to the adjacent thiophene moieties on the polymer chain. That is, the alkyl group is positioned on the thiophene moieties such that for two given adjacent thiophene moieties in the polymer backbone, only one alkyl group is oriented in the space between the two thiophene moieties. Most of the thiophene moieties in the polymer will have an alkyl group with this "regular" orientation. However, regioregular 3-alkylthiophene polymers wherein at least 95 percent of the thiophene moieties have alkyl substituents with such an orientation are contemplated as suitable.

In one embodiment of the present invention, the TFT is a metal-insulator-semiconductor field effect transistor (MIS-FET) with an active layer of an organic semiconductor material. The TFT is formed on a conventional substrate material such as glass, silicon, or plastic. A layer of insulating material is formed over the substrate using a variety of techniques including spin coating, casting or screen printing. The term insulating material refers to a material that has a conductivity that is less than about $10^{-12}$S/cm. The active layer is formed over the insulating layer.

The devices typically have three spaced-apart contacts. At least two of the contacts are in physical contact with the organic semiconductor layer and are adapted to have a current travel through at least a portion of such semiconductor layer. The third contact, physically connected to the substrate, is adapted to control the current through the semiconductor layer located between the first and second contacts. The contacts are made of a metal. Metals useful as contacts in MIS-FET devices are conventional and well known to one skilled in the art. One example of a suitable metal is gold.

In the process of the present invention, the active semiconducting layer is formed by applying a solution of the organic material combined with a solvent over the layer of insulating material. The solution of organic material and solvent is applied using a variety of techniques including spin-coating, casting and printing.

Other objects and features of the present invention will become apparent from the following detailed description considered in conjunction with the accompanying drawings. It is to be understood, however, that the drawings are designed solely for purposes of illustration and not serve to limit the invention, for which reference should be made to the appended claims.

DETAILED DESCRIPTION

The present invention is directed to a process for fabricating a TFT device having an active semiconducting layer. The active semiconducting layer is an organic polymer that has a carrier mobility greater than about $10^{-3}$ cm$^2$/Vs and a conductivity less than about $10^{-5}$ S/cm. The devices produced by the process of the present invention have an on/off ratio greater than about $10^3$ at 20° C.

Figure 1:
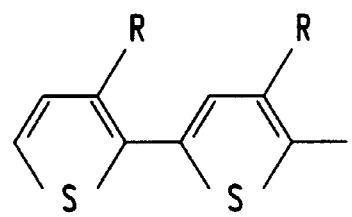
FIG. 1 is an illustration of the structure of a poly(3-alkylthiophene) compound incorporating a regioregular structure with head-to-tail (HT) linkages.

FIG. 1 is an illustration of a regioregular homopolymer of 3-alkylthiophene monomers useful as the active semiconducting layer of a TFT. The alkyl group has at least two to twelve carbon atoms and is designated generally by the letter R in FIGS. 1 and 2. Examples of the alkyl groups include branched chains such as isopropyl and isobutyl as well as linear alkyl chains. The alkyl groups are either substituted or unsubstituted. If substituted, examples of suitable substituents include carboxylic acid, sulfonic acid, and thiol.

Figure 2:
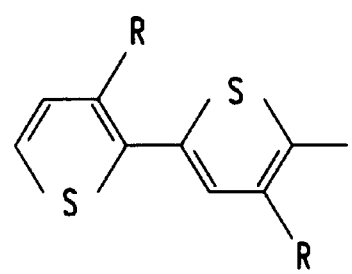
FIG. 2 illustrates the complementary HT linkages for the regioregular structure shown in FIG. 1.

In the regioregular homopolymer of 3-alkylthiophene monomers, the orientation of the alkyl group on the thiophene moiety is regular with respect to the adjacent thiophene moieties of the polymer chain. Thus, for two given adjacent thiophene moieties in the polymer backbone, only one alkyl group is oriented in the space between the two thiophene moieties. Two different regioregular poly (3-alkylthiophene) structures are illustrated in FIGS. 1 and 2, respectively. FIG. 1 illustrates a structure in which the thiophene moieties are oriented uniformly with respect to the polymer backbone. Consequently, the R groups in FIG. 1 are on one side of the polymer chain. FIG. 2 illustrates a structure in which the orientation of the thiophene moieties in the chain with respect to the polymer backbone alternate between a first orientation and a second orientation. The R groups on the thiophene moieties with the first orientation are on a first side of the polymer backbone. R groups on the thiophene moieties with the second orientation are on the side of the polymer backbone opposite the first side. Since the location of the R groups in the polymers depicted in FIGS. 1 and 2 is regular, the structures are denominated as regioregular. Such a regioregular orientation of the R groups on the thiophene moieties that make up the polymer backbone will hereinafter be referred to as having a head-to-tail (HT) linkage. Typically, a homopolymer of 3-alkylthiophene monomers has at least 95% HT linkages, with a small number of the thiophene moieties (less than about 5%) in the polymer chain having an orientation that does not conform to the regioregular orientation.

Figure 3:
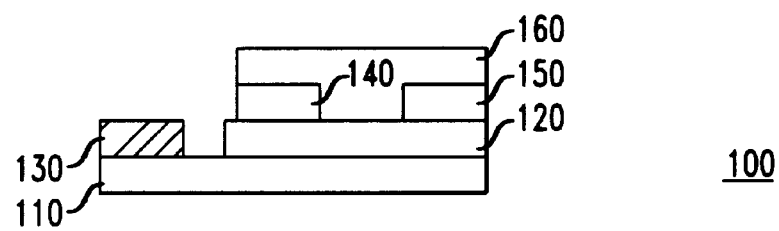
FIG. 3 is a metal-insulator-semiconductor (MIS) FET made using the process of the present invention.
Figure 4:
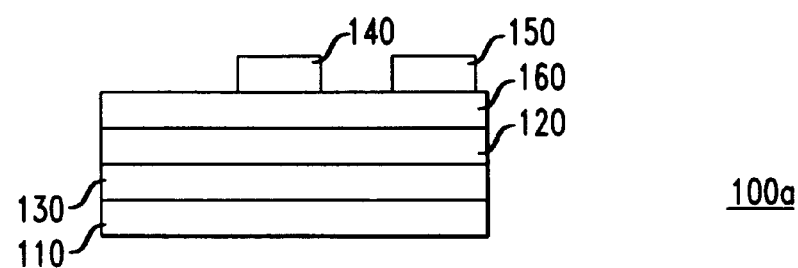
FIG. 4 is a variation of the MISFET shown in FIG. 3.

FIG. 3 illustrates an example of a metal-insulator-semiconductor (MIS) FET type device made using the process of the present invention. The MISFET 100 includes a substrate 110 over which a layer of insulating material 120 and a metal contact 130 are formed. Two additional metal contacts, 140 and 150, are formed over the layer of insulating material. A layer of organic semiconducting material 160 is formed over and between the contacts 140 and 150. (In another example of a MISFET, shown in FIG. 4, metal contact 130 is formed between the substrate 110 and the layer of insulating material 120, and the metal contacts 140, 150 are formed on organic semiconducting material 160).

The substrate 110 is made of conventional materials such as silicon, glass, or plastic. The contacts 130, 140, 150 are made of a conventional material for this purpose such as gold, indium-tin-oxide (ITO), conductive ink, or conducting polymer. The contacts 130, 140, 150 are formed using well known, conventional techniques which are not discussed in detail herein.

In one embodiment, the layer of insulating material 120 is an organic material. Examples, of organic insulating materials include polyimides, polyesters, and polymethylmethacrylate (PMMA). The layer of insulating material is formed by casting, spin coating or printing the organic insulating material on the substrate surface. In one embodiment, the insulating layer is printed on the substrate using a screen mask. The screen mask is made of a stainless steel fabric with 400 mesh count per inch and an emulsion thickness of about 7.5 micrometers ($\mu$m). The organic material is applied to the stainless steel fabric and a squeegee (doctor blade) is used to press the organic material through the openings in the screen and onto the substrate surface. Insulating layers formed using such screen printing have thicknesses approximating 0.1 micrometers ($\mu$m) to 1.0 micrometers ($\mu$m). Typically, the capacitance of the insulating material should be about $10^{-8}$ F/cm$^2$ (farads/square centimeter). The layer of insulating material is optionally formed of an inorganic material such as silicon dioxide, silicon nitride ($Si_3N_4$), or aluminum oxide ($Al_2O_3$), using well known conventional techniques.

The active organic semiconducting material 160 is formed by applying a solution of the regioregular organic polymer and an appropriate solvent, using conventional techniques such as spin-coating, casting, or printing. For example, regioregular poly (3-alkylthiophene) compounds are soluble in chlorinated organic solvents such as chloroform, methylene chloride, chlorobenzene, and tetrachloroethylene. It is desirable for the organic polymer to be completely dissolved in the solvent because discontinuities occur in films formed from solutions containing precipitated polymers. The thickness of the organic semiconducting material 160 is at least 300 Å.

By way of example, MIS-FET type TFTs, such as the MIS-FET shown in FIG. 3, are formed with a 12 $\mu$m channel length and a 250 $\mu$m gate length on an n-doped silicon substrate 110. A 3000 Å thick layer of silicon dioxide ($SiO_2$) is formed over the substrate 110. The insulating material 120 is the $SiO_2$ layer having a capacitance of about 10 nF/cm$^2$ (nanofarads/square centimeter). Two separate gold contacts 140, 150 are formed over the layer of insulating material 120. A third contact is formed directly on the silicon substrate 110. A layer of poly (3-alkyithiophene) is formed over the insulating material 120 and the contacts 140, 150 formed thereon.

EXAMPLE

Regioregular poly (3-hexylthiophene) (PHT), poly (3-octylthiophene) (POT) and poly (3-dodecylthiophene) (PDT) were obtained from Aldrich Chemical Company. The linkages in these polymers were at least 98.5% head-to-tail (HT). The polymers had a number averaged molecular weight above 25,000 and polydispersity of about 1.5. These polymers were purified by dissolving them in toluene and precipitating from acetone. The purification was performed three times total and the polymer was then extracted with acetone.

Each regioregular poly (3-alkylthiophene) (0.01 g/ml) was dissolved in chloroform at room temperature and filtered through a 0.200 μm pore size polytetraflouroethylene (PTFE) membrane syringe filter.

Devices were formed using the above identified regioregular poly (3-alkylthiophene) compounds as the active layer, as generally described above with reference to FIG. 3. The solution containing the dissolved polymer was applied over the insulating layer by casting, with the thickness of the resulting films dependent on the solution concentration. The substrate was dried in a vacuum environment for up to 24 hours. The poly (3-alkylthiophene) films were optionally exposed to gaseous ammonia ($NH_3$) for up to 10 hours, by placing the substrate in an enclosure where nitrogen ($N_2$) gas was bubbled through an ammonium hydroxide aqueous solution.

The carrier mobility and conductivity for various films prepared as described above are reported in Table I below. On/off ratios for devices fabricated from these films are also reported.

apparent threshold voltage ($V_0$) of the device is determined from the relationship between the square root of the drain-source current ($I_{DS}$) at the saturated region and the gate voltage ($V_G$) of the device by extrapolating from the measured values back to $I_{DS}$=0. The $I_{DS}$ at the saturated region is determined by observing the relationship between the drain-source voltage ($V_{DS}$) and the drain-source current at a given $V_G$. $I_{DS}$ at the saturated region is where $I_{DS}$ no longer increases with increasing drain-source voltage. $I_{DS}$ at the saturated region varies with $V_G$. This method for determining $V_0$ is conventional and well known to persons skilled in the art.

The conductivity was determined from $$\sigma = \frac{C_i V_0 \mu}{d}$$

where $C_i$ is the capacitance of the insulating layer, $V_0$ is the apparent threshold voltage, $\mu$ is the carrier mobility, and d is the thickness of the semiconducting polymer film.

The on/off ratio is the ratio of the drain current flowing in saturation when the gate voltage ($V_G$) is equal to or greater than the drain voltage ($V_D$) to the drain current flowing when $V_G$ is zero. For example, if $I_{DS}$ is $9 \times 10^{-6}$ A when $V_D$ and $V_G$ are both −100 V and $I_{DS}$ is $1 \times 10^{-9}$ A when $V_G$=0 and $V_D$=−100 V, then the on/off ratio of the device is $9 \times 10^3$.

Figure 5:
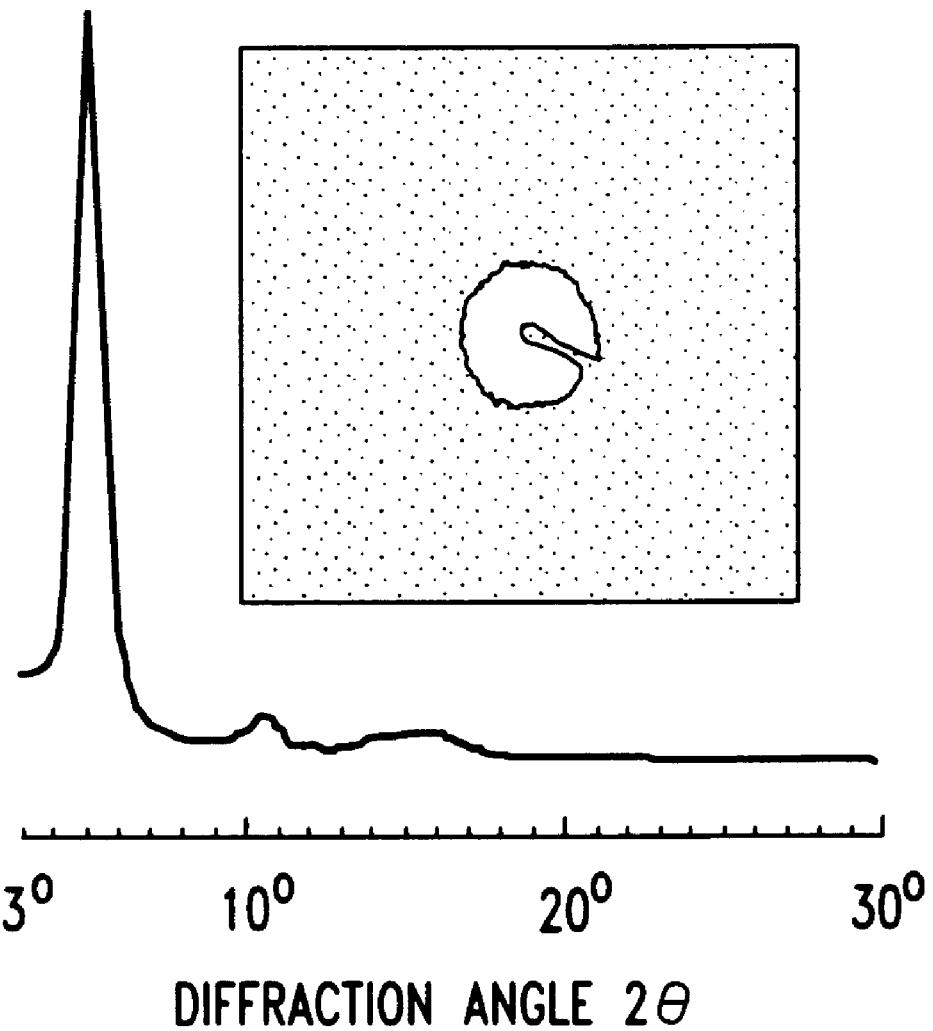
FIG. 5 shows x-ray diffraction and electron diffraction analysis of a poly (3-hexylthiophene) layer.

Although the inventors do not wish to be held to a particular theory, it is believed that the performance of the device is linked to the morphology of the poly(3-alkylthiophene) films. X-ray diffraction analysis of the regioregular poly (3-hexylthiophene) films enumerated in TABLE I is shown in FIG. 5, which illustrates a very strong, sharp first order diffraction peak at 5.4°, a second order diffraction peak at 10.8°, and a third order diffraction peak at 16.3° corresponding to an intermolecular spacing of 16.36 Å (see graph). Such an intermolecular spacing provides for

TABLE I

|  | FILM CARRIER MOBILITY (cm²/Vs) | FILM CONDUCTIVITY (S/cm) | DEVICE ON/OFF RATIO |
|---|---|---|---|
| PHT | $1.0 - 3.9 \times 10^{-2}$ | $3 \times 10^{-5} - 1.5 \times 10^{-4}$ | 100–400 |
| PHT ($NH_3$ exposed)* | $1.0 - 2.1 \times 10^{-2}$ | $3 \times 10^{-7} - 1.5 \times 10^{-6}$ | 1000–9000 |
| POT | $1.0 - 2.5 \times 10^{-2}$ | $1.5 \times 10^{-5} - 7.5 \times 10^{-5}$ | 10–60 |
| PDT | $2 \times 10^{-6} - 10^{-4}$ | $4 \times 10^{-9} - 2 \times 10^{-7}$ | 10–30 |

*The PHT films were applied using casting, then the substrates dried in a vacuum environment and exposed to $NH_3$.

The range of values for the carrier mobility, conductivity, and on/off ratio reported in Table I were measured from devices formed using at least two substrates for each semiconducting material layer. For example, semiconducting organic polymer layers with the hexyl substituents were formed on ten substrates with at least twenty devices formed on each substrate.

The carrier mobility, $\mu$, reported in Table I was calculated using the following equation:

$$I_{DS} = (WC_i/2L)\mu(V_G - V_O)^2$$

where W is the channel width (250 μm), L is the channel length (12 μm) and $C_i$ is the capacitance per unit area of the layer of insulating material (10 nF/cm²). To calculate the carrier mobility, $\mu$, using the above-identified equation, the the planar stacking (parallel to the substrate surface) of layers of thiophene chains, spaced apart by the alkyl groups. Thus, the thiophene polymer backbone is generally parallel to the substrate surface.

Electron diffraction analysis performed for the same regioregular poly (3-hexylthiophene) films is also shown in the photograph of FIG. 5. Electron diffraction illustrates a major peak at about 3.7–3.8 Å, which corresponds to the distance between the stacked thiophene rings in adjacent chains. Such a value for the thiophene ring spacing indicates a preferred orientation in which the hexyl groups are orientated about normal to the surface of the substrate with the direction of the stacked thiophene chains parallel to the substrate.

What is claimed is:

1. A process for fabricating organic thin film transistors (TFTs), comprising the steps of:

forming a gate electrode on a substrate;
printing a layer of insulating material over the substrate wherein the layer of insulating material is selected from the group consisting of polyimide, polyester, and polymethylmethacrylate (PMMA);
applying a solution of an organic material combined with a solvent therefore over the layer of insulating material and forming an active layer of organic material, wherein the active layer of organic material has a mobility greater than about $10^{-3}$ cm$^2$/Vs; and
forming a source electrode and a drain electrode in contact with the active layer of organic material layer.

2. A process for fabricating organic thin film transistors (TFTs), comprising the steps of:
forming a gate electrode on a substrate;
printing a layer of insulating material over the substrate;
printing a solution of an organic material combined with a solvent therefor over the layer of insulating material and forming an active layer of organic material, wherein the active layer of organic material has a mobility greater then about $10^{-3}$ cm$^{-2}$/Vs; and
forming a source electrode and a drain electrode in contact with the active layer of organic material.

3. The process of claim 2, wherein the active layer of the organic material is regioregular poly(3-alkylthiophene).

4. The process of claim 3, wherein the regioregular poly(3-alkylthiophene) has a structure selected from the group consisting of

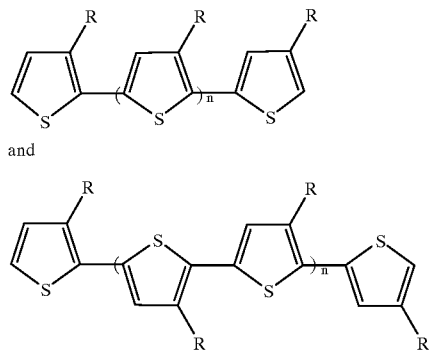

and

5. The process of claim 4, wherein R is a substituted alkyl group or an unsubstituted alkyl group.

6. The process of claim 5, wherein the alkyl has two to twelve carbon atoms.

7. The process of claim 2, wherein the solvent is a chlorinated organic solvent.

8. The process of claim 7, wherein the chlorinated organic solvent is chloroform.

9. The process of claim 2, wherein the layer of insulating material is selected from the group consisting of polyimide, polyester, and polymethylmethacrylate (PMMA).

10. A process for fabricating organic thin film transistors (TFTs), comprising the steps of:
forming a gate electrode on a substrate;
forming a layer of insulating material over the substrate;
applying a solution of regioregular poly(3-alkylthiophene) combined with a solvent therefore over the layer of insulating material and forming an active layer of regioregular poly(3-alkylthiophene), wherein the active layer of regioregular poly(3-alkylthiophene) has a mobility greater than about $10^{-3}$ cm$^2$/Vs; and
forming a source electrode and a drain electrode in contact with the active layer of regioregular poly(3-alkylthiophene).

11. The process of claim 10, wherein the regioregular poly(3-alkylthiophene) has a structure selected from the group consisting of

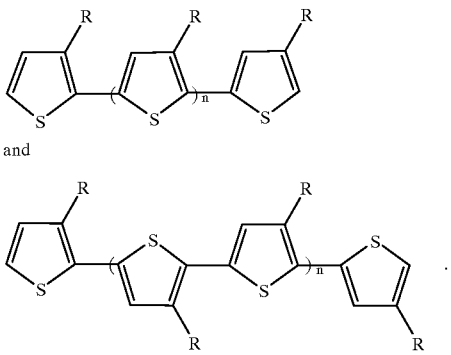

and

12. The process of claim 11, wherein R is a substituted alkyl group or an unsubstituted alkyl group.

13. The process of claim 12, wherein the alkyl group has two to twelve carbon atoms.

14. The process of claim 10, wherein the chlorinated organic solvent.

15. The process of claim 14, wherein the chlorinated organic solvent is chloroform.

16. The process of claim 10, wherein the solution of the regioregular poly(3-alkylthiophene) combined with the solvent is printed over the insulating layer.

* * * * *